United States Patent
Venkateswaran

(10) Patent No.: US 7,084,011 B2
(45) Date of Patent: Aug. 1, 2006

(54) FORMING A CHIP PACKAGE HAVING A NO-FLOW UNDERFILL

(75) Inventor: Muthiah Venkateswaran, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 93 days.

(21) Appl. No.: 10/748,023

(22) Filed: Dec. 30, 2003

(65) Prior Publication Data

US 2005/0140028 A1    Jun. 30, 2005

(51) Int. Cl.
*H01L 23/43* (2006.01)

(52) U.S. Cl. ............... 438/118; 438/108; 257/783; 257/778

(58) Field of Classification Search ......... 257/778–783
See application file for complete search history.

(56) References Cited

U.S. PATENT DOCUMENTS

| | | | |
|---|---|---|---|
| 6,069,024 A * | 5/2000 | Murakami | 438/108 |
| 6,404,062 B1 * | 6/2002 | Taniguchi et al. | 257/778 |
| 6,576,495 B1 * | 6/2003 | Jiang et al. | 438/108 |
| 2002/0043711 A1 * | 4/2002 | Akram et al. | 257/690 |

* cited by examiner

*Primary Examiner*—Leonardo Andujar
(74) *Attorney, Agent, or Firm*—Yingsheng Tung; Wade James Brady, III; Frederick J. Telecky, Jr.

(57) ABSTRACT

A method of forming an underfilled chip package is provided. No-flow underfill material is deposited over a surface of a package substrate to form an underfill region. A die having a plurality of solder bumps is placed at an angle relative to the package substrate such that solder bumps adjacent a first side of the die contact the surface of the package substrate within the underfill region while solder bumps adjacent a second side of the die are generally located at a distance away from the surface of the package substrate. The second side of the die is moved toward the surface of the package substrate until the solder bumps adjacent the second side of the die contact the surface such that the underfill material is forced into the area between the plurality of bumps.

11 Claims, 2 Drawing Sheets

FORMING A CHIP PACKAGE HAVING A NO-FLOW UNDERFILL

TECHNICAL FIELD OF THE INVENTION

This invention relates in general to chip packages, and, more particularly, to forming a chip package having a no-flow underfill.

BACKGROUND OF THE INVENTION

As small consumer electronics such as mobile phones and personal digital assistants (PDAs) continue to proliferate at an unprecedented rate, the need for smaller and more reliable chip packaging has increased. In particular, a group of chip packages have been developed in which the chip, or die, is bonded to a package substrate through a number of solder bumps, rather than wire bonds. Such chip packages include, for example, flip-chip packages, direct chip attach packages, wafer-scale chip scale packages (CSPs), and fine-pitch CSPs.

Such packages often include an encapsulant, or underfill, material disposed generally between the die and the substrate, which increases the structural integrity of the package. In some applications, no-flow underfill materials are used in order to increase package throughput and reduce fabrication costs. No-flow underfill materials include flux, which cleans the solder bumps before the bumps are attached to the package substrate.

By using such a no-flow underfill material that includes flux, the underfill may be dispensed onto the substrate before the die is attached to the substrate, which eliminates the time-consuming process of separately heating the substrate to bond the solder bonds to the substrate and then dispensing the underfill material into the areas between the solder bonds. However, a common problem associated with the use of no-flow underfills is the presence of voids or bubbles formed within the underfill material. Such voids or bubbles negatively impact the structural integrity and reliability of the package. For example, moisture may becoming trapped inside such voids and later expand, thus causing the die to separate from substrate, a phenomenon referred to as "popcorn failure." As another example, during subsequent heating processes (such as during a subsequent reflow process to attach the package substrate to a printed circuit board), solder material from solder bumps may flow into voids within the underfill material and cause a short between two or more solder bumps.

SUMMARY OF THE INVENTION

In accordance with the present invention, a chip package is formed having a no-flow underfill such that the underfill material is generally free of voids or bubbles, thus increasing the structural integrity and reliability of the package.

According to one embodiment, a method of forming an underfilled chip package is provided. No-flow underfill material is deposited over a surface of a package substrate to form an underfill region. A die having a plurality of solder bumps is placed at an angle relative to the package substrate such that solder bumps adjacent a first side of the die contact the surface of the package substrate within the underfill region while solder bumps adjacent a second side of the die are generally located at a distance away from the surface of the package substrate. The second side of the die is moved toward the surface of the package substrate until the solder bumps adjacent the second side of the die contact the surface such that the underfill material is forced into the area between the plurality of bumps.

According to another embodiment, an underfilled chip package is provided that includes a substrate having a surface, a die having a plurality of solder bumps attached thereto, and a layer of no-flow underfill material disposed generally between the die and the substrate. The chip package is formed by depositing no-flow underfill material over the surface of the package substrate to form an underfill region; placing the die at an angle relative to the package substrate such that one or more of the solder bumps adjacent a first side of the die contact the surface of the package substrate within the underfill region while one or more of the solder bumps adjacent a second side of the die opposite the first side of the die are generally located at a distance away from the surface of the package substrate; and moving the second side of the die toward the surface of the package substrate until the one or more solder bumps adjacent the second side of the die contact the surface such that the underfill material is forced into the area between the plurality of bumps.

Various embodiments of the present invention may benefit from numerous advantages. It should be noted that one or more embodiments may benefit from some, none, or all of the advantages discussed below.

One advantage is that by placing a die onto a substrate at an angle and rotating the die in order to squeeze underfill material through the areas between the solder bumps, the size and/or number of voids or bubbles within the underfill material is reduced. This technique may be used to reduce or eliminate various problems common with underfill chip packages, such as flip-chip packages, direct chip attach packages, wafer-scale chip scale packages (CSPs), and fine-pitch CSPs, for example. First, the likelihood of moisture becoming trapped inside voids within the underfill material is reduced, which reduces the likelihood of such moisture expanding and causing the die to separate from substrate 14 (commonly referred to as "popcorn failure"). Second, the likelihood of solder material from the solder bumps flowing into a void within the underfill material during subsequent heating processes (such as a subsequent reflow process to attach the package substrate to a printed circuit board, for example), and thereby causing a short between two or more solder bumps, is reduced.

Other advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Figure 1:
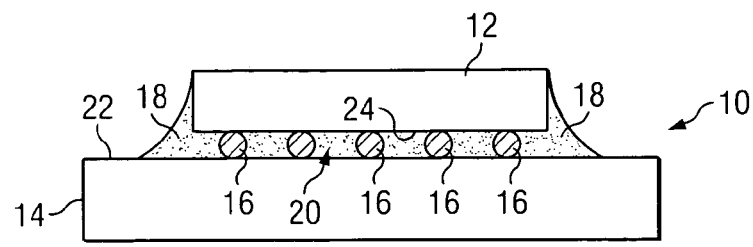
FIG. 1 illustrates a side view of an example underfilled flip-chip package according to an embodiment of the present invention.
Figure 2A:
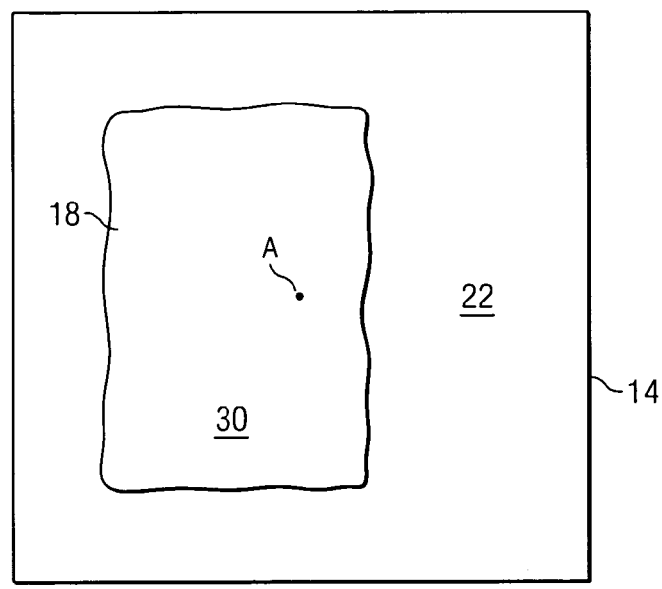
FIGS. 2A through 2E illustrate side and top views of an example method of forming the underfilled flip-chip package of FIG. 1.
Figure 2B:
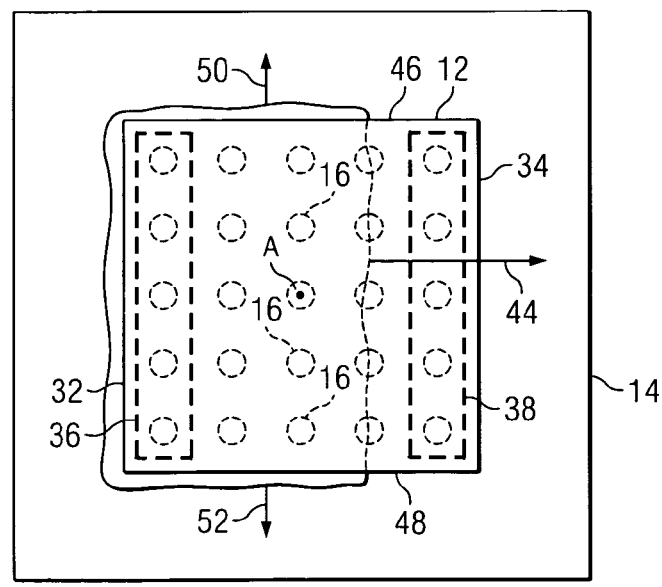
Figure 2C:
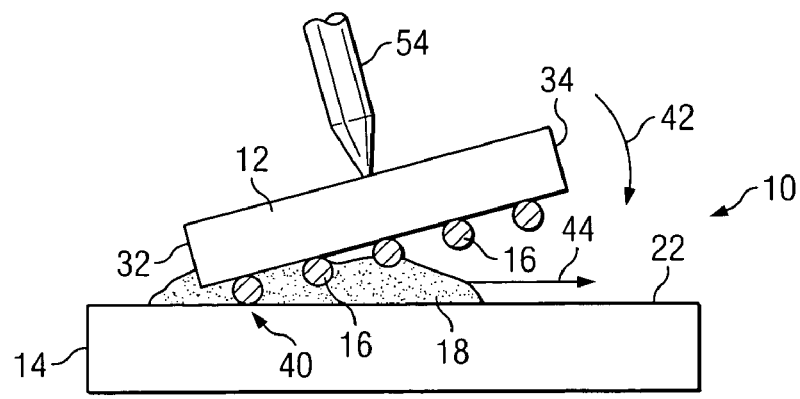
Figure 2D:
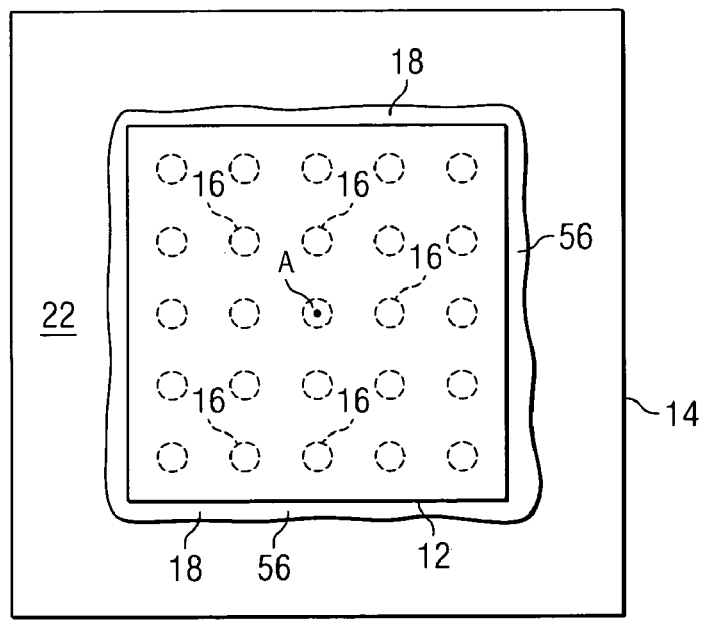
Figure 2E:
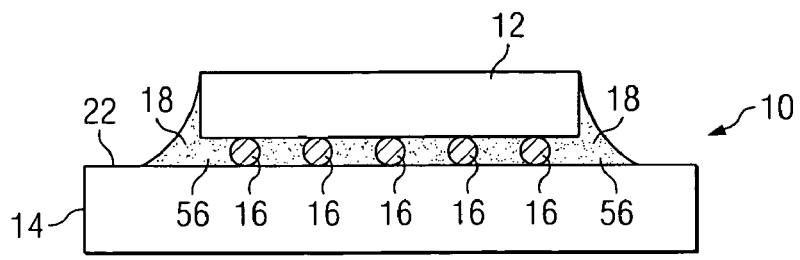

Example embodiments of the present invention and their advantages are best understood by referring now to FIGS. 1 through 2E of the drawings, in which like numerals refer to like parts.

Among other things, various embodiments of the present invention are directed toward forming an underfilled flip-chip package having an underfill material substantially free of voids or bubbles, thus increasing the structural integrity and reliability of the package.

FIG. 1 illustrates a side view of an example underfilled flip-chip package 10 including a chip, or die, 12 coupled to a package substrate 14 through a plurality of solder bumps 16. A layer of encapsulant, or underfill, material 18 is disposed generally between die 12 and substrate 14. Underfill material 18 extends into the area 20 between the plurality of solder bumps 16. As shown in FIG. 1, the layer of underfill material 18 also extends beyond the footprint of die 12 and may generally form a fillet around the perimeter of die 12 between the outer surfaces of die 12 and an upper surface 22 of package substrate 14.

Die 12 may have any suitable pattern of solder bumps 16 attached thereto. For example, a full array of solder bumps 16 may be attached to the under surface 24 of die 12. Alternatively, solder bumps 16 may only be attached around the perimeter of the under surface 24 of die 12 such that the center area inside the perimeter is not bumped. It should be understood that die 12 may have any other pattern of bumps 16 as the particular design might require.

Die 12 may be a silicon die or any other type of chip or die suitable for an underfilled flip-chip package 10. Package substrate 14 may be any suitable substrate for an underfilled flip-chip package, such as, for example, laminate FR4; laminate BT, High Tg FR4; Teflon; ceramic/glass; polyimide; or leadframe. Solder bumps 16 may be formed from any suitable material, such as a tin/lead alloy, an electroless nickel/immersion gold alloy, or gold, for example.

Underfill material 18 is a no-flow underfill material that includes a flux material mixed with any suitable underfill material, such as an epoxy or suitable organic material, for example. The flux material acts to clean the surface of the solder bumps 16 such that an effective solder bond may be created between the solder bumps 16 and substrate 14 during the bonding reflow process. As described in greater detail below with reference to FIGS. 2D and 2E, once underfill material 18 is cured through the reflow process, it provides improved structural integrity for package 10.

FIGS. 2A through 2E illustrate top and side views of a method of forming flip-chip package 10 in accordance with certain embodiments of the present invention. In particular, FIGS. 2A, 2B and 2D illustrate top views or various stages in the method of forming package 10, FIG. 2C illustrates a side view of FIG. 2B, and FIG. 2E illustrates a side view of FIG. 2D.

As shown in FIG. 2A, no-flow underfill material 18 having flux is pre-dispensed onto substrate 14 to form a region 30 of underfill material 18. The region 30 of underfill material 18 is formed offset in a first direction from the geometric center of surface 22 of substrate 14, indicated in FIG. 2A as point "A."

As shown in FIGS. 2B and 2C, die 12 having an array of solder bumps 16 pre-attached to the under surface 24 thereof (in other words, die 12 is "pre-bumped") is oriented and placed against substrate 14 an angle relative to substrate 14 such that a first side 32 of die 12 is closer to the upper surface 22 of substrate 14 than a second side 34 of die 12.

In a particular embodiment, die 12 is placed such that a first row 36 of solder bumps 16 located adjacent the first side 32 of die 12 come into contact with the upper surface 22 of substrate 14, while a second row 38 of solder bumps 16 located adjacent the second side 34 of die 12 are generally located at a distance away from the upper surface 22 of substrate 14. A contact point or area 40 is formed between each of the first row 36 of solder bumps 16 and surface 22.

In addition, die 12 is placed such that one or more of the first row 36 of solder bumps 16 is located within the region 30 of underfill material 18, thus squeezing the adjacent underfill material 18 into the areas around and between such solder bumps 16. Further, die 12 is centered with respect to the center point "A" of surface 22 of substrate 14.

The second side 34 of die 12 is moved toward the surface 22 of substrate 14, as indicated by arrow 42, until the second row 38 of solder bumps 16 adjacent the second side 34 of die 14 come into contact with surface 22. Thus, die 12 is rotated about contact points 40 between the first row 36 solder bumps 16 and surface 22 substrate 14.

As the second side 34 of die 12 is moved toward the surface 22 of substrate 14, the underfill material 18 between die 12 and substrate 14 is squeezed, or forced, into the open areas between solder bumps 16. At least a portion of the underfill material 18 generally flows in a direction from the first side 32 to the second side 34 of die 12, as indicated by arrow 44. This direction is generally the opposite direction as the direction in which the region 30 of underfill material 18 was formed offset from the center "A" of surface 22. In addition, a portions of the underfill material 18 flow outward towards the remaining outer sides of die 12, indicated as sides 46 and 48. This flow of underfill material 18 toward sides 46 and 48 of die 12 is indicated in FIG. 2B generally by arrows 50 and 52, respectively. Thus, in certain embodiments, as the second side 34 of die 12 is moved toward the surface 22 of substrate 14, underfill material 18 is generally squeezed in the directions indicated by arrows 44, 50 and 52. In this manner, the resulting region of underfill material 18 may be substantially centered about center point "A" (and thus centered about die 12). In addition, in certain embodiments, the resulting region of underfill material 18 may completely or substantially cover each of the plurality of solder bumps 16.

As the underfill material 18 is squeezed toward the sides of die 12 as described above, voids or bubbles in the underfill material 18 between die 12 and substrate 14 are generally forced out from the area between die 12 and substrate 14. Thus, such voids or bubbles are prevented from being trapped within the resulting region of underfill material 18, which provides several advantages, as discussed below with reference to FIGS. 2D and 2E.

In particular embodiments, as the second side 34 of die 12 is moved toward the surface 22 of substrate 14, die 12 is rotated about contact points 40 but is not moved in any direction parallel with surface 22 of substrate 14; thus, contact points 40 remain static. In other embodiments, die 12 is moved in one or more directions parallel with surface 22 of substrate 14 as the second side 34 of die 12 is moved toward and into contact with surface 22 of substrate 14. For example, die 12 may be moved in the direction indicated by arrow 44 as the second side 34 of die 12 is moved toward and into contact with surface 22 of substrate 14.

Die 12 may be positioned and moved using any suitable device or process. For example, as shown in FIG. 3C, die 12 may be positioned and moved using a vacuum nozzle 54 that attaches to die 12 by vacuum suction.

FIGS. 2D and 2E illustrate top and side views, respectively, of the resulting region of underfill material 18 formed by placing die 12 onto substrate 14 as described above. The resulting region of underfill material 18 extends around die 12 and forms a fillet 56 between the outer sides of die 12 and surface 22 of substrate 22.

A heated reflow process may then be performed on package 10, which both cures underfill material 18 and forms structural joints between solder bumps 16 and substrate 14. The cured underfill material 18 reduces the shear stress between the solder bumps 16 and the upper surface 22 of package substrate 14, and/or between solder bumps 16 and the under surface 24 of die 12. Such shear stresses may be caused or intensified by various heating and cooling processes involved in the subsequent manufacturing of package 10 or a device into which package 10 is incorporated, particularly due to the difference in the coefficients of thermal expansion (CTE) between die 12 and substrate 14.

By forming package 10 as described above, the underfill material 18 is substantially free of the voids or pockets that are typically present in the underfill material of packages formed using prior methods. By reducing or eliminating the number and/or size of voids or pockets within underfill material 18, various problems may be reduced or eliminated. For example, the likelihood of moisture becoming trapped inside voids within underfill material 18 is reduced, which reduces the likelihood of such moisture expanding and causing die 12 to separate from substrate 14 (commonly referred to as "popcorn failure"). As another example, the likelihood of solder material from solder bumps 16 flowing into a void within underfill material 18 during subsequent heating processes (such as a subsequent reflow process to attach substrate 14 to a printed circuit board, for example), and thereby causing a short between two or more solder bumps 16, is reduced. Thus, the structural integrity and reliability of package 10 are improved as compared with packages formed using prior techniques.

It should be understood that in alternative embodiments, the present invention contemplates using methods with additional steps, fewer steps, or different steps, so long as the steps remain appropriate for forming an underfilled flip-chip package by placing a die onto a substrate at an angle and rotating the die in order to squeeze underfill material through the areas between the solder bumps.

In addition, although package 10 illustrated in FIGS. 1 through 2E and discussed above is a flip-chip package, similar methods as described herein may be used in forming various other types of underfilled chip packages, such as direct chip attach packages, wafer-scale CSPs, and fine-pitch CSPs, for example, in order to reduce or eliminate the number and/or size of voids or bubbles within the underfill material of the chip package.

In addition, although embodiments of the invention and its advantages have been described in detail, a person skilled in the art could make various alterations, additions, and omissions without departing from the spirit and scope of the present invention as defined by the appended claims.

What is claimed is:

1. A method of forming an underfilled chip package, comprising:
    depositing a underfill material over a surface of a package substrate to form an underfill region;
    placing a die having a plurality of solder bumps at an angle relative to the package substrate such that one or more of the solder bumps adjacent a first side of the die contact the surface of the package substrate within the underfill region while one or more of the solder bumps adjacent a second side of the die opposite the first side of the die are generally located at a distance away from the surface of the package substrate; and
    moving the second side of the die toward the surface of the package substrate until the one or more solder bumps adjacent the second side of the die contact the surface such that the underfill material is forced into the area between the plurality of bumps.

2. The method of claim 1, further comprising performing a heated reflow process to connect the solder bumps to the surface of the packing substrate and to cure the underfill material.

3. The method of claim 2, further comprising performing an additional heated reflow process to connect the packing substrate to a printed surface board.

4. The method of claim 1, wherein moving the second side of the die toward the surface of the package substrate until the one or more solder bumps adjacent the second side of the die contact the surface causes the underfill material to flow generally in a direction from the first side of the die toward the second side of the die.

5. The method of claim 1, wherein:
    the underfill region is formed offset from the geometric center of the substrate in a first direction;
    the die is placed in the geometric center of the substrate; and
    moving the second side of the die toward the surface of the package substrate until the one or more solder bumps adjacent the second side of the die contact the surface causes the underfill material to flow generally in a second direction opposite the first direction.

6. The method of claim 1, wherein moving the second side of the die toward the surface of the package substrate comprises rotating the die about the points of contact between the one or more solder bumps adjacent the first side of the die and the surface of the package substrate.

7. The method of claim 1, further comprising moving the die in a first direction parallel with the surface of the package substrate simultaneous with moving the second side of the die toward the surface of the package substrate.

8. The method of claim 7, wherein the first direction is a direction from the first side of the die toward the second side of the die when the solder bumps adjacent both the first and second sides of the die are in contact with the surface of the package substrate.

9. The method of claim 1, wherein the die is placed adjacent the package substrate using a vacuum nozzle.

10. The method of claim 1, wherein the chip package is a flip-chip package.

11. A method of forming an underfilled chip package, comprising:
    depositing a underfill material over a surface of a package substrate to form an underfill region;
    placing a die having a plurality of solder bumps at an angle relative to the package substrate such that one or more of the solder bumps adjacent a first side of the die contact the surface of the package substrate within the underfill region while one or more of the solder bumps adjacent a second side of the die opposite the first side of the die are generally located at a distance away from the surface of the package substrate; and
    moving the second side of the die toward the surface of the package substrate by rotating the die about the points of contact between the one or more solder bumps adjacent the first side of the die and the surface of the package substrate until the one or more solder bumps adjacent the second side of the die contact the surface, wherein such rotation of the die causes at least a portion of the underfill material to flow generally in a direction from the first side of the die toward the second side of the die and into the area between the plurality of bumps; and
    performing a heated reflow process to connect the solder bumps to the surface of the packing substrate and to cure the underfill material.

* * * * *